(12) United States Patent
Chen et al.

(10) Patent No.: US 6,945,504 B2
(45) Date of Patent: Sep. 20, 2005

(54) ADJUSTABLE CABLE MANAGEMENT ARM FOR FURNITURE

(75) Inventors: Ken-Ching Chen, Kaohsiung Hsien (TW); Shih-Long Hwang, Kaohsiung Hsien (TW); Chun-Chiang Wang, Kaohsiung Hsien (TW); Jung-Pin Chen, Kaohsiung Hsien (TW)

(73) Assignee: King Slide Works Co., Ltd., Kaohsiung Hsien (TW)

( * ) Notice: Subject to any disclaimer, the term of this patent is extended or adjusted under 35 U.S.C. 154(b) by 34 days.

(21) Appl. No.: 10/223,348

(22) Filed: Aug. 20, 2002

(65) Prior Publication Data

US 2004/0035995 A1 Feb. 26, 2004

(51) Int. Cl.$^7$ .............................. E04G 3/00; A47F 7/00
(52) U.S. Cl. ...................... 248/282.1; 211/26; 211/151; 174/69; 361/826
(58) Field of Search .......................... 248/282.1, 276.1, 248/281.11, 298.1, 279.1, 257, 259, 265, 269; 174/69

(56) References Cited

U.S. PATENT DOCUMENTS

| | | | | |
|---|---|---|---|---|
| 999,283 A | * | 8/1911 | White ...................... | 248/282.1 |
| 2,458,967 A | * | 1/1949 | Wiedenhoeft ............ | 248/283.1 |
| 3,072,374 A | * | 1/1963 | Bodian .................... | 248/278.1 |
| 4,353,518 A | * | 10/1982 | Taylor et al. ................. | 248/60 |
| 4,605,995 A | * | 8/1986 | Pike .......................... | 362/287 |
| 4,614,383 A | * | 9/1986 | Polley et al. ................ | 312/273 |
| 5,571,256 A | * | 11/1996 | Good et al. .................... | 211/26 |
| 5,813,286 A | * | 9/1998 | Hansen ..................... | 74/490.02 |
| 6,070,742 A | * | 6/2000 | McAnally et al. ............ | 211/26 |
| 6,095,468 A | * | 8/2000 | Chirico et al. ........... | 248/282.1 |
| 6,303,864 B1 | * | 10/2001 | Johnson et al. ............... | 174/69 |
| 6,305,556 B1 | * | 10/2001 | Mayer ........................ | 211/26 |
| 6,326,547 B1 | * | 12/2001 | Saxby et al. ................. | 174/69 |
| 6,392,149 B1 | * | 5/2002 | Kim et al. ................ | 174/72 A |
| 6,435,354 B1 | * | 8/2002 | Gray et al. .................... | 211/26 |
| 6,523,918 B1 | * | 2/2003 | Baiza ...................... | 312/265.1 |
| 6,600,665 B2 | * | 7/2003 | Lauchner ..................... | 361/826 |
| 6,685,033 B1 | * | 2/2004 | Baddour et al. .............. | 211/26 |
| 6,715,718 B1 | * | 4/2004 | Chen et al. ................... | 248/49 |
| 6,811,039 B2 | * | 11/2004 | Chen et al. .................... | 211/26 |

\* cited by examiner

Primary Examiner—Anita M. King
(74) Attorney, Agent, or Firm—Bacon & Thomas

(57) ABSTRACT

An adjustable cable management arm devise. The device includes a pair of cable arms, pivotal pins, an adjustable arm, and an adjusting member. A first end of a first cable arm is connected to an end of a second cable arm, which is capable of folding each other, so as to form a combination of cable arms. The adjustable arm is inserted into an end of the combination of the cable arms and adapted to receive the pivotal pin. The adjustable arm is adapted to adjust a horizontal angle of a cable arm with respect to a wall bracket, so as to allowing the pivotal pin being smoothly rotated between the adjustable arm and the wall bracket.

7 Claims, 7 Drawing Sheets

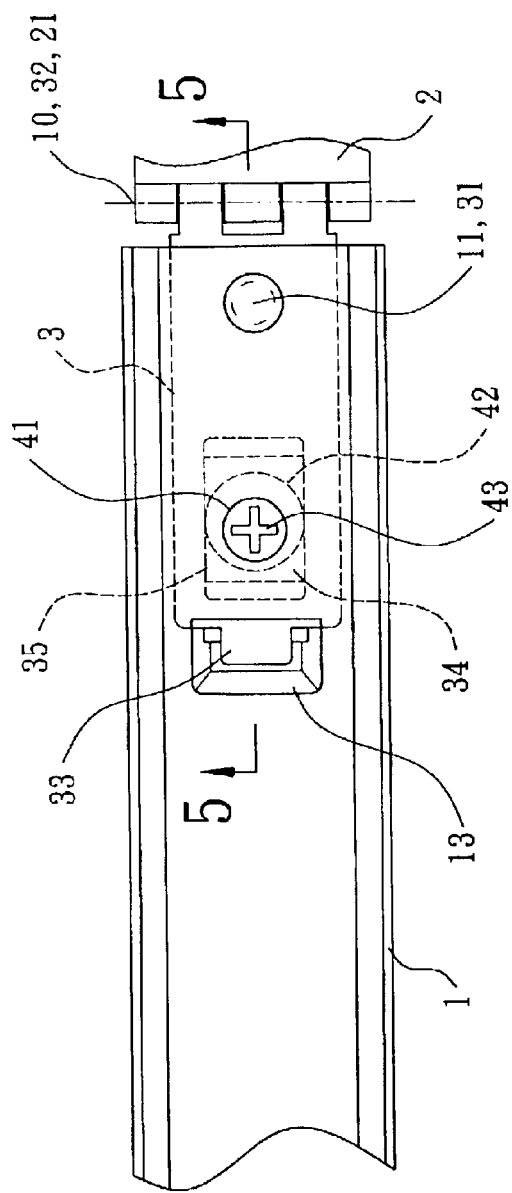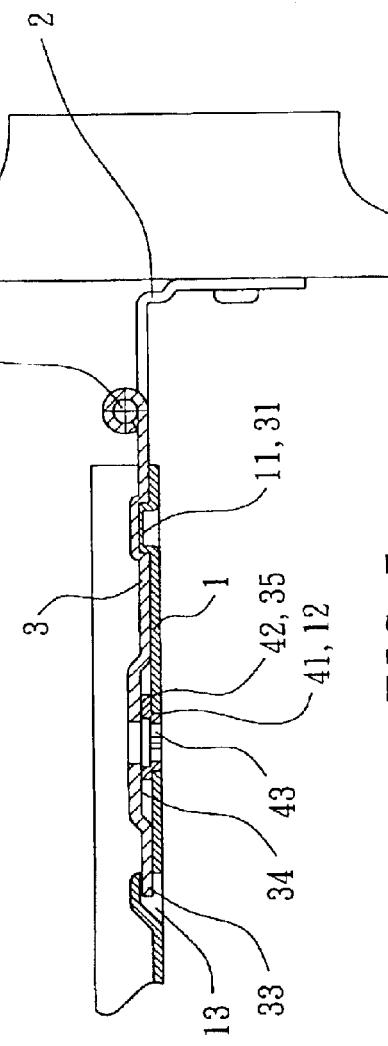

ADJUSTABLE CABLE MANAGEMENT ARM FOR FURNITURE

BACKGROUND OF THE INVENTION

1. Field of the Invention

The present invention is related to an adjustable cable management arm for furniture and more particularly to utilize an adjustable arm adjusting a horizontal angle of a cable arm with respect to a wall bracket, so that a pivotal pin connected between the adjustable arm and the wall bracket is capable of smoothly operating.

2. Description of the Related Art

Big industrial system, like factory computer and server, is consisted of a rack, and a plurality of individual component drawers. Large numbers of data cables and power cable connected between the rack and the component draw is usually served to communicate with other components and power supply. In order to flexibly repair and service the components installed, a cable management arm is generally used to manage these cables.

Referring to FIG. 1, a conventional cable management arm is consisted of a pair of cable arms 1. A first end of a first cable arm 1 is connected to an end of a second cable arm 1 by a pivotal pin 10, so as to allow the cable arms 1 to fold upon each other. Two ends of the combination of the cable arms 1 are connected to two wall brackets 2 which are fixed on predetermined rare positions of the component drawer and the rack. When the component drawer moves forward or rearward, the cable arms 1 are extended or retracted.

When the cable management arm is installed, the cable arms 1 must be maintained in horizontal position (such as being parallel to each other) to allow the pivotal pin 10 to operate smoothly. Otherwise, the pivotal pin 10 may cause extreme friction, noise, or irregular rotation between the cable arms 1 due to the cable arm 1 inclination to the bracket 2 as well as misalignment with a horizontal angular position of the bracket 2. Consequently, the cable management arm may malfunction due to abrasion of the pivotal pin 10 after long-term use.

The present invention intends to provide an adjustable cable management arm utilizing an adjustable arm adapted to adjust a horizontal angle of a cable arm with respect to a wall bracket in such a way to mitigate and overcome the above problem.

SUMMARY OF THE INVENTION

The primary objective of this invention is to provide an adjustable cable management arm comprising an adjustable arm adapted to adjust a horizontal angle of a cable arm with respect to a wall bracket, so as to allow a pivotal pin to smoothly rotate between the adjustable arm and the wall bracket.

The adjustable cable management arm of the present invention mainly comprises a pair of cable arms, a plurality of pivotal pins, an adjustable arm, and an adjusting member. A first end of a first cable arm is connected to an end of a second cable arm, which is capable of folding over each other, so as to form a combination of the cable arms. The adjustable arm is inserted into an end of the combination of the cable arms and is adapted to receive the pivotal pin. The adjustable arm is adapted to adjust a horizontal angle of a cable arm with respect to a wall bracket, so as to allow the pivotal pin to smoothly rotate between the adjustable arm and the wall bracket.

The embodiment of the cable arm comprises an axial member adapted to nest in a hole of the adjustable arm, and a slot adapted to confine angular movement of an end of the adjustable arm within a predetermined angle. When the adjustable arm is adjusted to a horizontal angular with respect to the wall bracket on the axial member by operating the adjusting member, the end of the adjustable arm is confined within the slot of the cable arm.

Other objectives, advantages and novel features of the invention will become more apparent from the following detailed description and the accompanying drawings.

BRIEF DESCRIPTION OF THE DRAWINGS

The present invention will now be described in detail with reference to the accompanying drawings herein:

FIG. 4 is a partial front view of the adjustable cable management arm in accordance with the first embodiment of the present invention;

FIG. 5 is a cross-sectional view, taken along line 5—5, of the adjustable cable management arm in accordance with the first embodiment of the present invention;

DETAILED DESCRIPTION OF THE INVENTION

Figure 1:
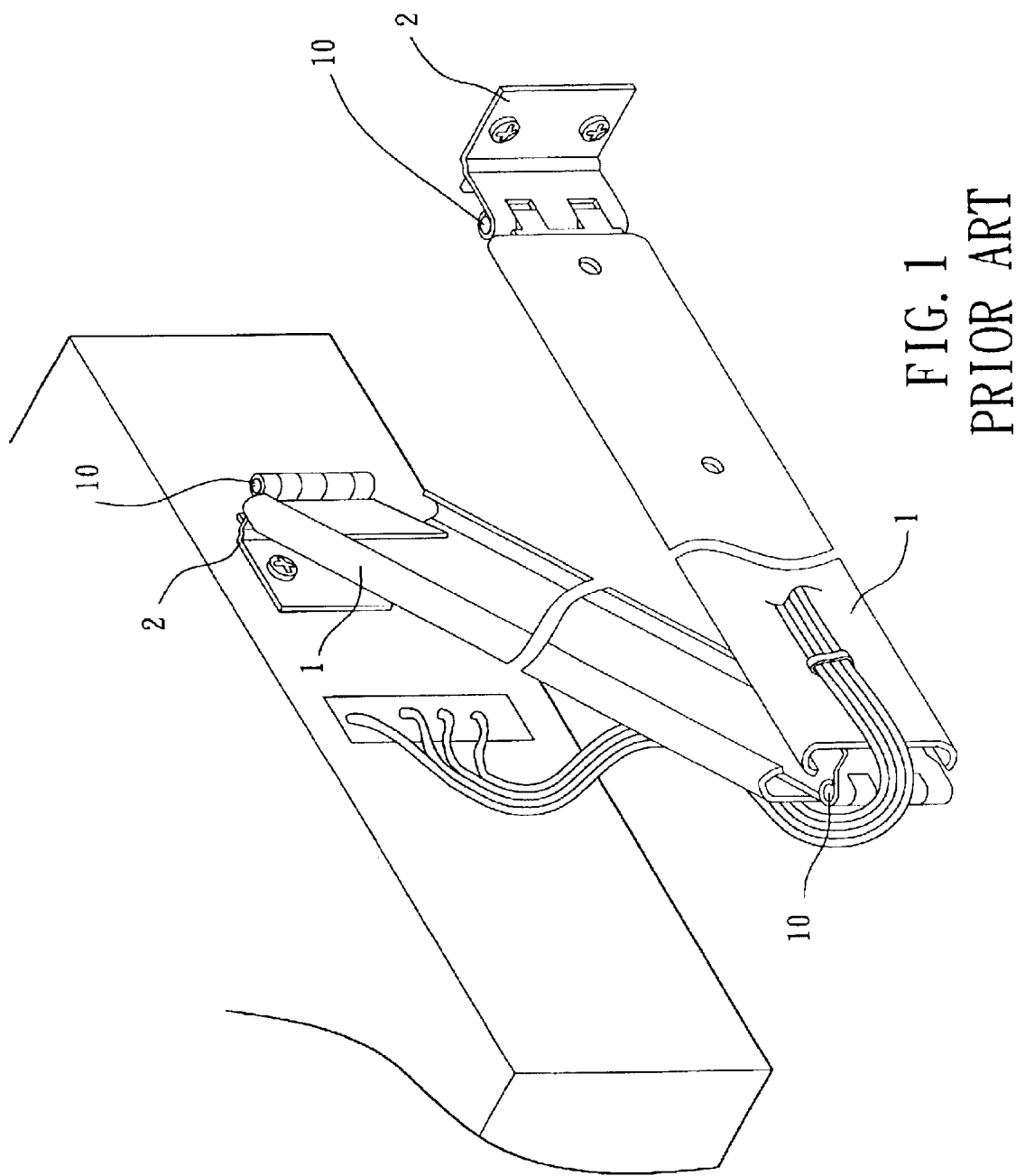
FIG. 1 is a perspective view of a conventional cable management arm in accordance with the prior art.
Figure 2:
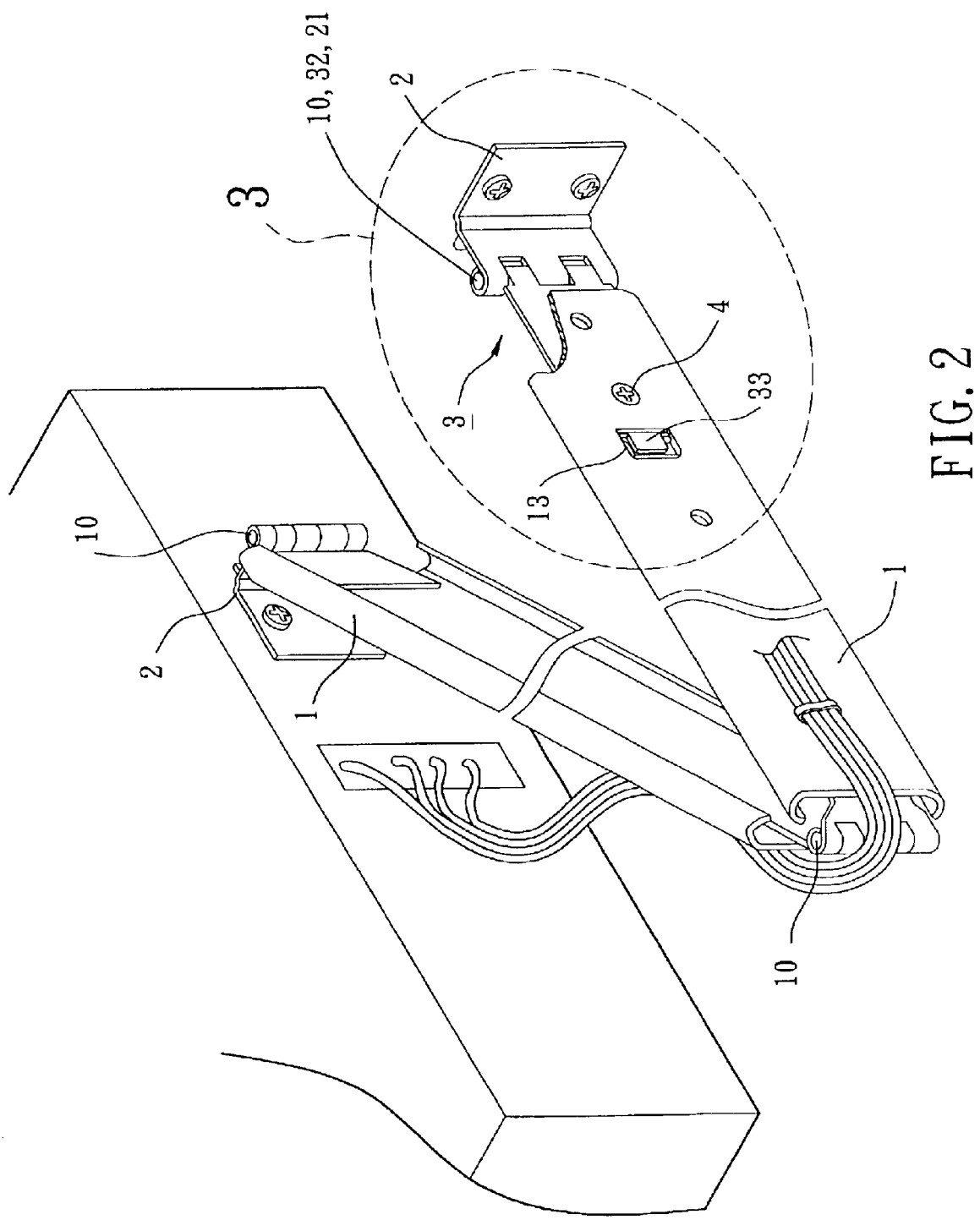
FIG. 2 is a perspective view of an adjustable cable management arm in accordance with a first embodiment of the present invention.
Figure 3:
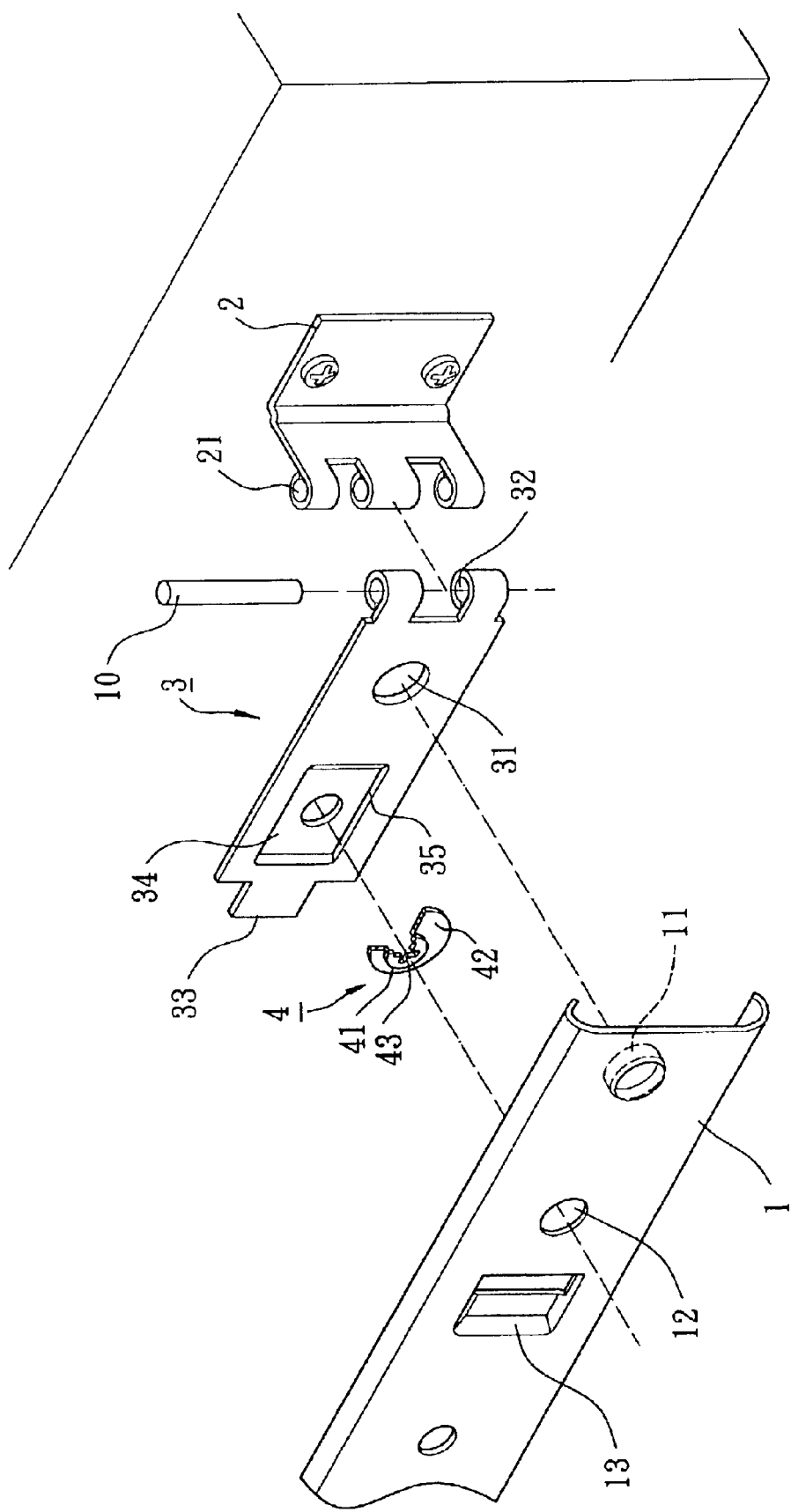
FIG. 3 is a partial exploded enlarged view of the adjustable cable management arm in accordance with the first embodiment of the present invention.

Referring initially to FIGS. 2 and 3, an adjustable cable management arm in accordance with a first embodiment of the present invention includes a pair of cable arms 1, a plurality of pivotal pins 10, an adjustable arm 3, and an adjusting member 4. A first end of a first cable arm 1 is connected to an end of a second cable arm 1, which is capable of folding upon each other, by the pivotal pin 10, so as to form a combination of the cable arms 1. The adjustable arm 3 is inserted into an end of the combination of the cable arms 1 and is adapted to receive the pivotal pin 10. The adjustable arm 3 is adapted to adjust a horizontal angle of a cable arm 1 with respect to a wall bracket 2 by operating the adjusting member 4, allowing the pivotal pin 10 to be smoothly rotate between the adjustable arm 1 and the wall bracket 2. The adjustable arm 3 comprises a hinge section 32 adapted to combine with a hinge section 21 of the bracket 2 through which the pivotal pin 10 is inserted, so as to allow pivotal movement therebetween.

Referring again to FIG. 2, the cable arm 1 in accordance with the first embodiment comprises an axial member 11 adapted to nest in a hole 31 of the adjustable arm 3, an opening 12 adapted to receive the adjusting member 4, and a slot 13 adapted to confine angular movement of an end of the adjustable arm 3 within a predetermined angle. Preferably, the axial member 11 is an axial tube or a stud adapted to mount to an axial hole 31 of the adjustable arm 3. The opening 12 is adapted to expose the adjusting member 4 which is rotated to adjust a horizontal angle of the adjustable arm 3 with respect to the bracket 2. In addition, the end of the adjustable arm 3 is inserted into the slot 13 of the cable arm 1 thereby confining angular movement within it.

Referring to FIGS. 2 and 4, the adjustable arm 3 comprises an axial member 11 adapted to insert into the axial hole 31 of the cable arm 1, and a distal end 33 adapted to insert into and confine within the slot 13 of the cable arm 1. The adjustable arm 3 further comprises a recessed compartment 34 defined by an annular rim 35. When assembled, the adjusting member 4 positioned in the recessed compartment 34 and thus confronted with the annular rim 35.

Referring again to FIGS. 2 through 4, the adjusting member 4 comprises a protrusion 41 adapted to insert into the opening 12 of the cable arm 1, an eccentric cam 42 adapted to confront against the annular rim 35 of the adjusting arm 3, and a cross groove 43 formed on the protrusion 41 adapted to be operated by a screw driver.

Referring to FIGS. 4 and 5, the adjustable arm 3 is connected to the cable arm 1 and to the wall bracket 2. The adjusting member 4 is positioned between the recessed compartment 34 of the adjustable arm 3 and the cable arm 1 while the adjustable arm 3 is inserted into the end of the cable arm 1. Meanwhile, the protrusion 41 of the adjusting member 4 is inserted into the opening 12 of the cable arm 1 and the eccentric cam 42 is abutted against the annular rim 35 of the adjusting arm 3.

Figure 6:
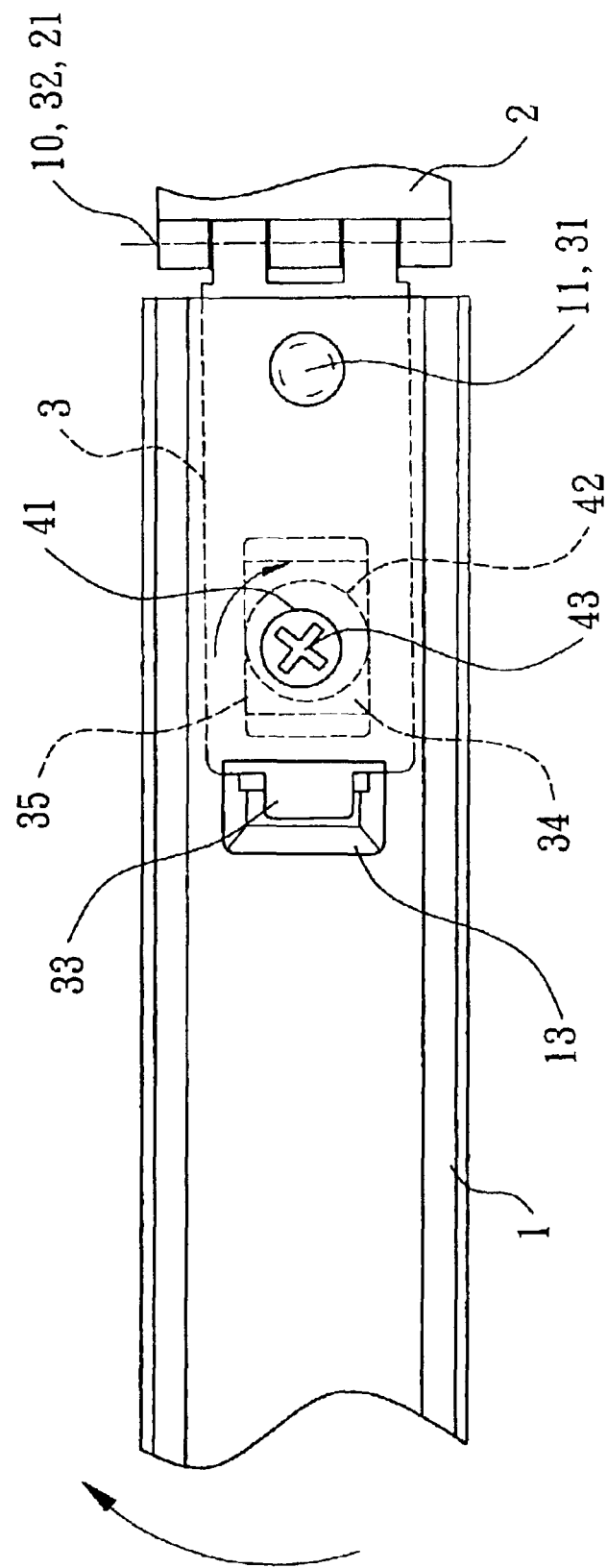
FIG. 6 is a partial front view of the adjustable cable management arm in adjusting the adjustable arm in accordance with the first embodiment of the present invention.

Referring to FIG. 6, when the cable arm 1 and the wall bracket 2 are initially assembled, the hinge section 32 of the adjustable arm 3 may be misaligned with a horizontal angular position of the hinge section 21 of the bracket 2 that may cause extreme friction. Subsequently, the pivotal pin 10 positioned between the two hinge sections 21 and 32 may be jammed with irregular rotation due to extreme friction. The adjusting member 4 is used to adjust a horizontal angle of the adjustable arm 3 with respect to the wall bracket 2 by a screw driver passing through the opening 12 to rotate the adjusting member 4 whose eccentric portion abuts against the annular rim 35 of the adjustable arm 3. When the adjusting member 4 is rotated to adjust the adjustable arm 3, the adjustable arm 3 must be forced to rotate approximately parallel to the horizontal angular position of the bracket 2. Consequently, the pivotal pin 10 connected between the bracket 2 and the adjustable arm 3 is capable of rotating smoothly.

Figure 7:
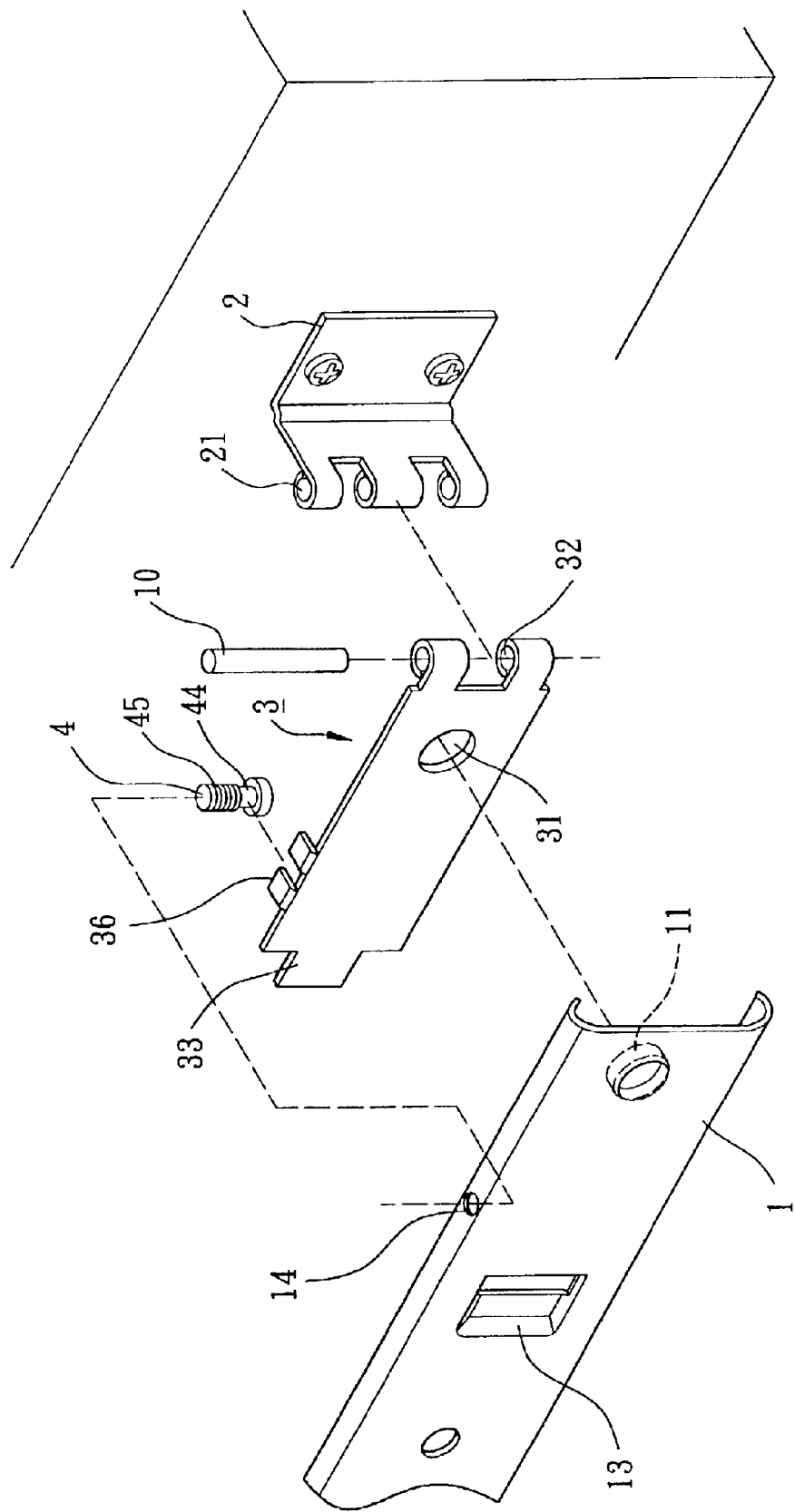
FIG. 7 is a perspective view of an adjustable cable management arm in accordance with a second embodiment of the present invention.
Figure 8:
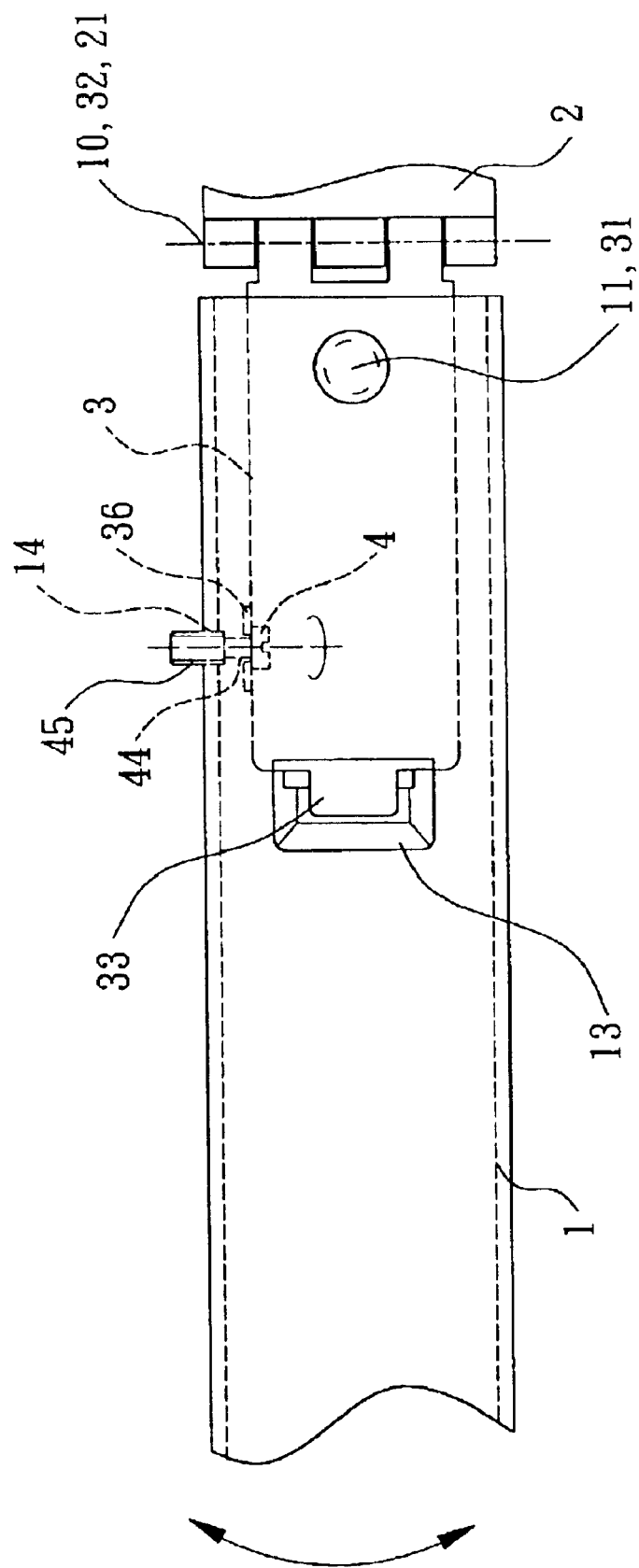
FIG. 8 is a partial front view of the adjustable cable management arm in adjusting the adjustable arm in accordance with the second embodiment of the present invention.

Referring to FIGS. 7 and 8, reference numerals of a second embodiment have applied the identical numerals of the first embodiment. The adjustable cable management arm of the second embodiment has the similar configuration and the same functions as the first embodiment and the detailed descriptions are omitted.

Referring again to FIGS. 7 and 8, the adjustable cable management arm in accordance with a second embodiment of the present invention includes a pair of cable arms 1, a plurality of pivotal pin 10, an adjustable arm 3 and an adjusting member 4. The adjustable arm 3 further comprises a seat 36 provided on its topmost edge adapted to mount the adjusting member 4, which is connected to the cable arm 1.

Referring to FIGS. 7 and 8, the cable arm 1 comprises an axial member 11 adapted to nest in a hole 31 of the adjustable arm 3, an opening 12 adapted to receive the adjusting member 4, a slot 13 adapted to confine angular movement of an end of the adjustable arm 3 within a predetermined angle, and a screw hole 14 aligned with the seat 36 of the adjustable arm 3.

Referring to FIGS. 7 and 8, the adjusting member 4 comprises a neck portion 44 adapted to be received in the seat 36 of the adjustable arm 3, and a thread portion 45 adapted to screw with a screw hole 14 of the cable arm 1 for adjusting a horizontal angular position of the adjustable arm 3.

Referring to FIG. 8, when the cable arm 1 and the wall bracket 2 are initially assembled, the hinge section 32 of the adjustable arm 3 may be mis-aligned with a horizontal angular position of the hinge section 21 of the bracket 2 that may cause extreme friction. Subsequently, the pivotal pin 10 positioned between the two hinge sections 21 and 32 may be jammed with irregular rotation due to extreme friction. The adjusting member 4 is used to adjust a horizontal angle of the adjustable arm 3 with respect to the wall bracket 2 by a screw driver rotating the adjusting member 4, so that an adjusting distance between the top edge of the cable arm 1 and the topmost edge of the adjustable arm 3 is increased or decreased. When the adjusting member 4 is rotated to adjust the adjustable arm 3, the adjustable arm 3 must be forced to rotate approximately parallel to the horizontal angular position the bracket 2. Consequently, the pivotal pin 10 connected between the bracket 2 and the adjustable arm 3 is capable of rotating smoothly.

Although the invention has been described in detail with reference to its presently preferred embodiment, it will be understood by one of ordinary skill in the art that various modifications can be made without departing from the spirit and the scope of the invention, as set forth in the appended claims.

What is claimed is:

1. An adjustable cable management arm comprising:

a cable arm including an axial member on its end;

an adjustable arm having an end connected to a wall bracket, the adjustable arm further including an axial member combined with the axial member of the cable arm and is adapted to adjust a horizontal angular position with respect to the wall bracket; and an adjusting member including a protrusion and an eccentric cam, said adjusting member adapted to adjust the horizontal angular position of the combination of the cable arm with the adjustable arm with respect to the wall bracket, so that a pivotal pin connected between the adjustable arm and the wall bracket is capable of rotating smoothly.

2. The adjustable cable management arm as defined in claim 1, wherein the axial member of the cable arm is an axial tube or a stud, and the axial member of the adjustable arm is an axial hole to which the axial tube or the stud is mounted.

3. The adjusting cable management arm as defined in claim 1, wherein the cable arm further comprises an opening and the adjustable arm further comprises a recessed compartment and annular rim thereof, the protrusion is inserted into the opening and is adapted to be operated by a screw driver and the eccentric cam is confronted against the annular rim adapted to adjust the horizontal angular position of the adjustable arm with respect to the wall bracket.

4. The adjustable cable management arm as defined in claim 1, wherein the adjustable arm further comprises an end inserted into a slot in the cable arm and is adapted to confine angular movement of the adjustable arm within a predetermined angle.

5. An adjustable cable management arm comprising:

a cable arm including an axial member on its end;

an adjustable arm having an end connected to a wall bracket, the adjustable arm further including an axial member combined with the axial member of the cable arm and is adapted to adjust a horizontal angular position of the adjustable arm with respect to the wall bracket;

an adjusting member adapted to adjust the horizontal angular position of the adjustable arm with respect to the wall bracket, so that a pivotal pin connected between the adjustable arm and the wall bracket is capable of rotating smoothly;

the axial member of the cable arm is an axial tube or a stud, and the axial member of the adjustable arm is an axial hole to which the axial tube or the stud is mounted; and the adjusting member comprises a protrusion, and an eccentric cam.

6. The adjusting cable management arm as defined in claim 5, wherein the cable arm further comprises an opening and the adjustable arm further comprises a recessed compartment and annular rim thereof, the protrusion is inserted into the opening and is adapted to be operated by a screw driver and the eccentric cam is confronted against the annular rim adapted to adjust the horizontal angular position of the adjustable arm with respect to the wall bracket.

7. The adjustable cable management arm as defined in claim 6, wherein the adjusting member further comprises a cross groove adapted to be rotated by the screw driver.

* * * * *